Figure 1:
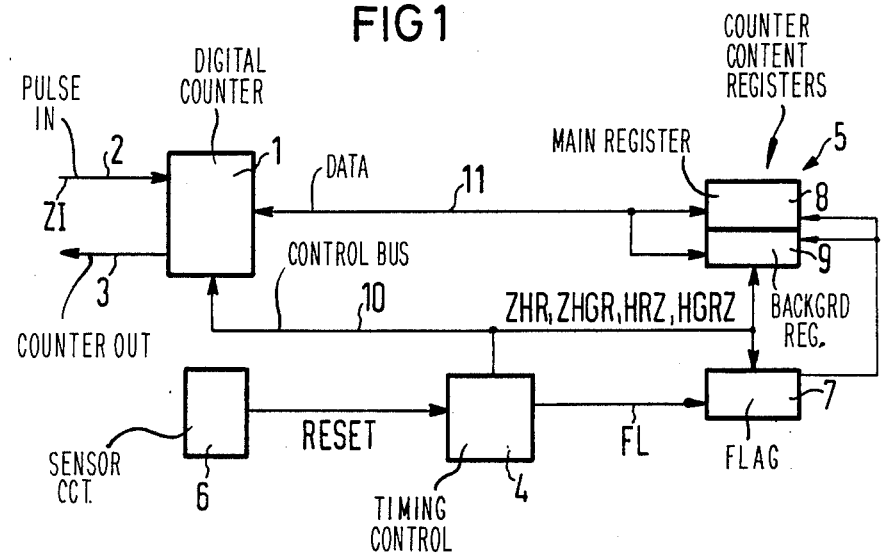

United States Patent [19]

Pockrandt

[11] Patent Number: 4,768,210

[45] Date of Patent: Aug. 30, 1988

[54] METHOD AND APPARATUS FOR FAILSAFE STORAGE AND READING OF A DIGITAL COUNTER IN CASE OF POWER INTERRUPTION

[75] Inventor: Wolfgang Pockrandt, Steinkirchen, Fed. Rep. of Germany

[73] Assignee: Siemens Aktiengesellschaft, Berlin and Munich, Fed. Rep. of Germany

[21] Appl. No.: 81,577

[22] Filed: Aug. 3, 1987

Related U.S. Application Data

[63] Continuation of Ser. No. 861,568, May 9, 1986, abandoned.

[30] Foreign Application Priority Data

May 17, 1985 [DE] Fed. Rep. of Germany ....... 3517865

[51] Int. Cl.[4] .................... G11C 7/00; H03K 21/40
[52] U.S. Cl. .................................... 377/32; 377/24.1; 377/30; 365/226
[58] Field of Search ................... 377/24.1, 30, 32; 365/226

[56] References Cited

U.S. PATENT DOCUMENTS 3,987,429 10/1976 Manduley et al. .................... 377/30
4,049,951 9/1977 Baty et al. .............................. 377/32
4,206,996 6/1980 Clark et al. ............................ 377/30
4,224,506 9/1980 Coppola et al. ....................... 377/32
4,528,683 7/1985 Henry ..................................... 377/24

FOREIGN PATENT DOCUMENTS 0067364 6/1982 Fed. Rep. of Germany .
3123444 1/1983 Fed. Rep. of Germany .
58608 5/1981 Japan ................................. 235/95 R Primary Examiner—John S. Heyman
Attorney, Agent, or Firm—Herbert L. Lerner; Laurence A. Greenberg

[57] ABSTRACT

A method for the non-volatile storage of the counter reading of a digital counter including storage locations for receiving counter readings and state information of a counting cycle, includes successively storing an actual counter reading in two independent counter reading registers, initially marking one of the registers containing a preceding counter reading, at least up to completion of a counter reading transfer into the other of the registers, subsequently marking the other register, and after a voltage interruption, transferring the counter reading of the marked register into the counter for presetting and selectively incrementing by 1, and an apparatus for carrying out the method.

6 Claims, 1 Drawing Sheet

METHOD AND APPARATUS FOR FAILSAFE STORAGE AND READING OF A DIGITAL COUNTER IN CASE OF POWER INTERRUPTION

This application is a continuation of application Ser. No. 861,568, filed May 9, 1986, now abandoned.

The invention relates to a method and an apparatus for the non-volatile storage of the counter reading of a digital counter, including storage locations for receiving counter readings and state information of the counting cycles.

Certain applications for digital counters, such as odometers in motor vehicles, require the storage of counting pulses in a non-volatile manner, in order to preserve the counter reading in the event of a power failure. However, due to an unfavorable or manipulated failure of the supply voltage, there is a danger of the previously stored information being changed in an uncontrolled manner during the storage process. Furthermore, securing the programming process with a holding capacitor can only provide a slight degree of protection, particularly against attempts at manipulation.

German Published Non-prosecuted Application DE-OS No. 31 23 444, corresponding to U.S. application Ser. No. 383,196, filed May 28, 1982, now U.S. Pat. No. 4,638,457, describes a digital counter for the non-volatile storage of the counter reading. In that device, a data memory with address regions is provided, into which the last respective counter reading is alternately written, clearing the preceding counter reading. Four flag registers which are parallel thereto, are set in a control memory for marking the programming cycle of the data storage regions. The counter reading can then be reconstructed by using the logical states of the flags, if the programming is broken off.

According to another embodiment of that device, four equivalent counter reading storage digits are cyclically traversed in writing as well as in reading. The device ensures that at least the old and the actual counter readings are stored in one of the storage locations. Two other storage locations either serve for receiving the next counter reading or are required for reprogramming the storage locations. Therefore, a relatively large number of storage locations are required in both embodiments.

It is accordingly an object of the invention to provide a method and apparatus for the non-volatile storage of the counter reading of a digital counter, which overcomes the hereinafore-mentioned disadvantages of the heretofore-known methods and devices of this general type, and which can be operated with a smaller number of storage locations.

With the foregoing and other objects in view there is provided, in accordance with the invention, a method for the non-volatile storage of the counter reading of a digital counter including storage locations for receiving counter readings and state information of a counting cycle, which comprises successively storing an acutal counter reading in two independent counter reading registers, initially marking one of the registers containing a preceding counter reading, at least up to completion of a counter reading transfer into the other of the registers, subsequently marking the other register, and after a voltage interruption, transferring the counter reading of the marked register into the counter for presetting and selectively incrementing by 1.

The advantage of the invention is that the operating speed is increased due to the smaller number of programming processes.

In accordance with another mode of the invention, there is provided a method which comprises:

transferring the counter reading into one of the registers acting as a main register;

incrementing the counter upon arrival of a counting pulse;

marking the other of the registers acting as a background register;

transferring the counter reading into the main register;

marking the main register; and transferring the counter reading into the background register.

In accordance with a further mode of the invention, there is provided a method which comprises;

regularly terminating the counting process in which the main register is marked and subsequently:

transferring the content of the main register into the counter; and storing the counter reading in the background register.

In accordance with an added mode of the invention, there is provided a method which comprises:

irregularly terminating completion of the counting process in which the background register is marked and subsequently:

transferring the content of the background register into the counter;

incrementing the counter reading;

storing the counter reading in the main register;

marking the main register; and transferring the counter reading into the background register.

With the objects of the invention in view there is also provided an apparatus for the non-volatile storage of the counter reading of a digital counter, comprising a cycle control connected to the counter, a voltage sensor addressing the cycle control, two independent non-volatile counter reading registers connected to the counter, and a one-bit-wide flag register connected to the counter and to the registers and controlled by the cycle control in dependence on respective process steps.

Other features which are considered as characteristic for the invention are set forth in the appended claims.

Although the invention is illustrated and described herein as embodied in a method and an apparatus for the non-volatile storage of the counter reading of a digital counter, it is nevertheless not intended to be limited to the details shown, since various modifications and structural changes may be made therein without departing from the spirit of the invention and within the scope and range of equivalents of the claims.

Figure 2:
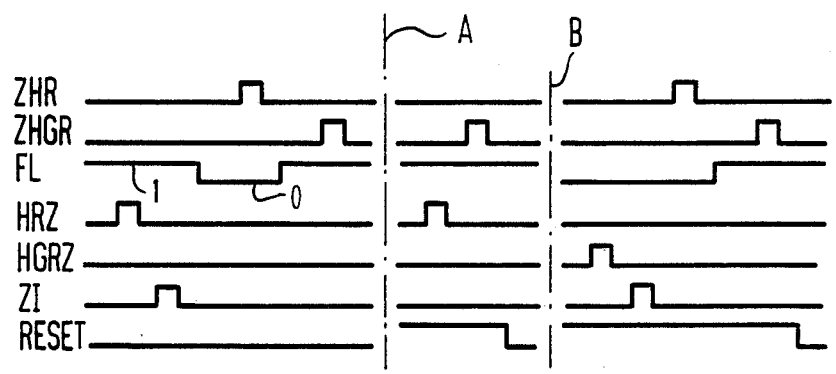

The construction and method of operation of the invention, however, together with additional objects and advantages thereof will be best understood from the following description of specific embodiments when read in connection with the accompanying drawings, in which:

FIG. 1 is a block circuit diagram of the apparatus according to the invention; and FIG. 2 is a timing diagram for the apparatus according to FIG. 1.

Referring now to the figures of the drawings in detail and first, particularly, to FIG. 1 thereof, there is seen a digital counter 1, the counter reading of which is incremented due to counting pulses ZI on an input line 2. The actual counter reading can be taken off at an output line 3. The counter reading of the counter 1 is controlled by a cycle or timing control 4 and can be transferred through a data bus 11 into two non-volatile counter reading (i.e. "content") registers 5 which are independent of each other and will be referred to below as main and background registers 8, 9, respectively. Conversely, the content of the counter reading register 5 can be written into the counter 1 for pre-setting a counter reading. A sensor circuit 6 detects a break in the supply voltage of the counter 1 or of the entire apparatus and delivers a reset, i.e. a break-off or interruption signal RESET to the cycle control 4. The apparatus also includes a flag register 7 which can be set by the cycle control 4. One of the registers 8 or 9 is marked by the flag register 7, which is also non-volatile. The addressing of the counter 1, of the counter reading register 5 and the flag register 7 is accomplished by the cycle control unit 4 through a bi-directional control bus 10. In the event of a request for counting, a procedure which is controlled by the cycle control 4 and will be described below with the aid of the diagram in FIG. 2, is performed.

A control signal HRZ transfers the content of the main register 8 into the counter 1. During uninterrupted counter operation, the current counter reading is stored in the main register 8. The counter content is increased when each next counter pulse ZI arrives. The flag register 7 is subsequently programmed by a control signal so that it marks the background register 9. In this case, a logical 1 of the flag FL points to the main register 8, while a logical 0 designates the background register 9.

The current counter reading which is at that time contained in the counter 1 is then deposited by a control signal ZHR in the main register 8, in a non-volatile manner. The flag register 7 which marks the main register 8 is programmed by a change in level of the control signal FL. The counter reading is subsequently stored in the background register 9 by a control signal ZHGR.

During the entire counter incrementing operation, the counter 1 cannot be influenced externally, since the programming voltage is generated within the apparatus and the programming process is only terminated after a predetermined programming level is reached. The execution of such a step is described in detail in German Published, Non-prosecuted Application DE-OS No. 28 28 855.

As soon as the RESET signal is generated by the sensor circuit 6, due to a supply voltage break, one of the following alternative cycles is carried out, depending on the instant in the counting cycle at which the break-off or interruption signal RESET occurs.

CYCLE A

The interruption signal RESET is generated after the preceding counting process has been completed in a regular fashion. The flag FL thus flags the main register 8. The cycle control 4 generates the control signal HRZ and the information stored in the main register 8 is transferred into the counter 1. The counter information is subsequently stored in the background register 9 due to said control signal ZHGR.

CYCLE B

The preceding counting process is irregularly terminated. The flag thus flags the background register 9. A control signal HGRZ transfers the content of the background register 9 into the counter 1. The counter reading is then incremented. The new counter reading is subsequently stored in the main register 9 by the control signal ZHR. After the flag FL is programmed so that it points to the main register 8, the new counter reading is transferred to the background register 9.

I claim:

1. Method for failsafe storage of the count of a digital pulse counter having a non-volatile main and a non-volatile background register, a non-volatile flag for storing state information of a counting cycle and a sensor for sensing a power interruption, which comprises: initially marking the background register with the flag; writing the counter content into the main register; subsequently marking the main register with the flag; writing the counter content into the background register;

writing the content of the main register back into the counter if a power interruption is sensed after the counter content has been written into the background register; or writing the present content of the background register back into the counter if a power interruption is sensed after the counter content has been written into the main register and before the counter content has been written into the background register; and subsequently incrementing the counter.

2. Method according to claim 1, wherein a power interruption sensed after the counter content has been written into the background register is a regular termination and a power interruption sensed after the counter content has been written into the main register and before it has been written into the background register is an irregular termination, which comprises: writing, in case of regular termination of the counting process and the main register is marked the content of the main register into the counter; and writing the counter content into the background register.

3. Method according to claim 1, which comprises:
writing, in case of irregular termination of the counting process and the background register is marked, the content of the background register into the counter and subsequently incrementing the counter;

writing the content of the counter into the main register; marking the main register with the flag; and writing the content of the counter into the background register.

4. Method according to claim 1, which comprises:
writing, in case of irregular termination of the counting process and the background register is marked the content of the background register into the counter;

incrementing the counter content;
storing the counter content in the main register;
marking the main register with the flag; and
writing the counter content into the background register.

5. Method according to claim 1, which comprises:
writing, in case of irregular termination of the counting process and the background register is marked the content of the background register into the counter;

incrementing the counter content;
storing the counter content in said main register;
marking the main register; and writing the counter content into the background register.

6. Apparatus for failsafe storage of the count of a digital pulse counter, comprising a timing control, a voltage sensor for sensing a power failure addressing said timing control, two independent non-volatile counter content registers connected to the counter for storing the content of said counter, and a one-bit-wide flag register connected to the counter and to said registers, the counter, the count registers and the one bit wide flag register being controlled by said timing control in in response to said voltage sensor.

* * * * *